United States Patent [19]

Bakker et al.

[11] 4,260,893

[45] Apr. 7, 1981

[54] DEVICE FOR DIRECTING ELECTRICALLY CHARGED PARTICLES TOWARDS A TARGET

[75] Inventors: Pieter Bakker, Amsterdam; Rudolf S. Kuit, Leiden; Jarig Politiek, Amsterdam, all of Netherlands

[73] Assignee: U.S. Philips Corporation, New York, N.Y.

[21] Appl. No.: 36,943

[22] Filed: May 7, 1979

[30] Foreign Application Priority Data

May 12, 1978 [NL] Netherlands .......................... 7805137

[51] Int. Cl.$^3$ ............................................. H01J 37/00
[52] U.S. Cl. ................................. 250/397; 250/492 A; 250/398
[58] Field of Search ........... 250/492 A, 492 R, 492 B, 250/396 R, 397, 398; 313/359, 361

[56] References Cited

U.S. PATENT DOCUMENTS

| 3,576,438 | 4/1971 | Pease ..................................... 250/311 |
| 4,071,765 | 1/1978 | Van Oostrum et al. ............. 250/397 |
| 4,119,854 | 10/1978 | Tanaka et al. .................... 250/492 A |

Primary Examiner—Bruce C. Anderson
Attorney, Agent, or Firm—Thomas A. Briody; Robert T. Mayer; Paul R. Miller

[57] ABSTRACT

A device for directing electrically charged particles towards a target present on a connection place of a support comprises an electrostatic deflection system having deflection plates for controlling a beam of charged particles in two mutually perpendicular directions towards the target with the deflection plates being brought at a desired voltage by means of an electronic control system, and two juxtaposed rods of electrically conductive material being provided on oppositely located sides of the target with the rods being each connected by a resistor to a fixed potential and being furthermore connected to a control device which reacts to a voltage which arises across the resistors if the beam of electrically charged particles impinges on a rod and which, if the beam, during each stroke across the target, impinges on a combination of rods other than the two innermost rods, produces a correction voltage for the control of the deflection plates.

6 Claims, 8 Drawing Figures

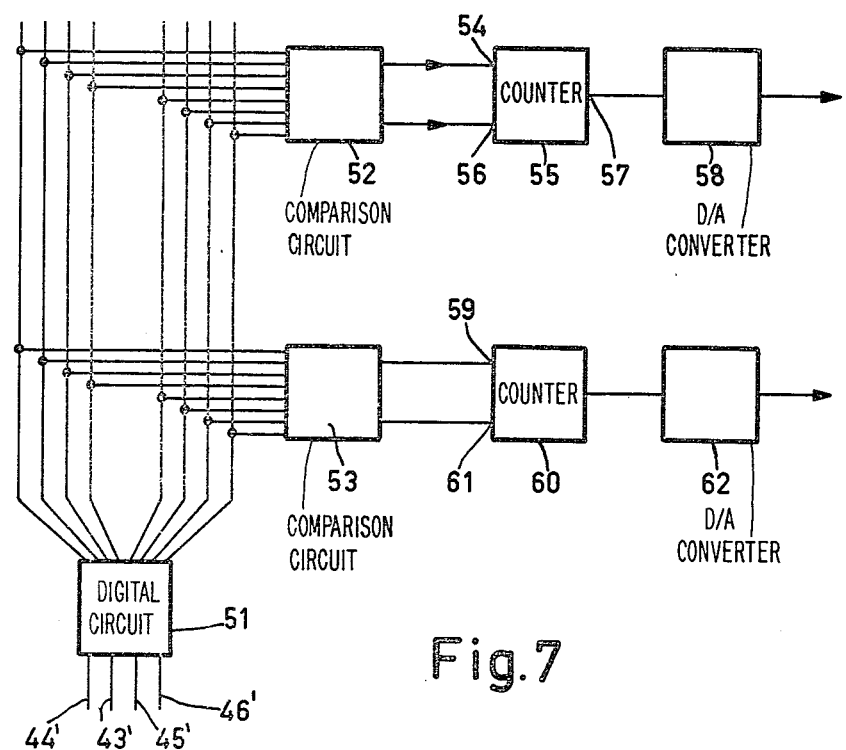
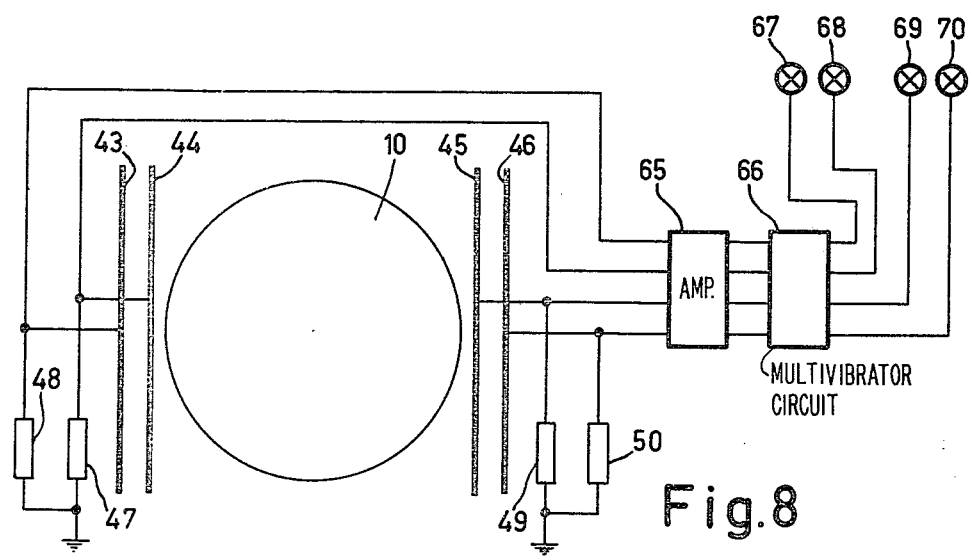

DEVICE FOR DIRECTING ELECTRICALLY CHARGED PARTICLES TOWARDS A TARGET

The invention relates to a device for directing electrically charged particles towards a target present on a connection place of a support, which device comprises a source for electrically charged particles, means to accelerate the particles and an electrostatic deflection system having deflection plates for controlling a beam of charged particles in two mutually perpendicular directions, the deflection plates being connected to voltage sources, and the value of the voltage on each of the deflection plates being controllable by means of an electronic control system.

Such a device may be an ion implantation device which is described here by way of example, but may alternatively be a device for controlling an electron beam.

In ion implantation devices having an electrostatic deflection system, the ion beam is directed towards the target and moves over the target according to a desired pattern by variation of the voltage on the deflection plates.

During implantation the ion beam usually describes a rectangular pattern which approaches as much as possible the perimeter of the target to be implanted. However, deviations from the desired pattern may occur in various manners. For example, the ion beam itself will not always enter the deflection plates at the same place or in the same direction. Furthermore, in the control device for the voltage on the deflection plates which is preferably constructed electronically, deviations may occur in the course of time, for example, caused by temperature variation in amplifiers. As a result of these undesired deviations, the stroke which the beam describes may be directed entirely too much to one side, hereinafter also termed deviation from the zero point adjustment, and the amplitude of the beam may also become too large or too small.

In one method of finding out whether the ion beam or electron beam will cover the entire target, a metal plate on which a salt, for example potassium bromide, is provided, is accommodated in front of the target. When charged particles impinge upon the salt, this will light up so that the path of the beam can be made visible. However, this requires a camera in the implantation space, as well as a monitor at the operating panel. In the case of small beam currents and a thin layer of salt, the luminous efficiency is too small to obtain a good picture. Furthermore, the vacuum in the implantation space is adversely influenced by the bombarded salt.

In the case of deviation from the desired zero point adjustment of the beam, or of the amplitude thereof, the beam must be readjusted. If an optimum efficiency is to be achieved, the readjustment will have to be done in time and accurately.

It is the object of the invention to provide a device of the kind mentioned in the preamble in which the zero point of the beam and also the amplitude are correctly adjusted automatically, in which hence a stable stroke of the beam is obtained and in which the disadvantages of using a layer of salt are avoided. In order to reach the end in view, according to the invention, each time two juxtaposed rods of electrically conductive material are provided near the support on oppositely located sides of the connection places, which rods are each connected by a resistor to a fixed potential, for example earth potential, and are furthermore connected to a control device which reacts to a voltage which is formed across the resistors if the beam of electrically charged particles impinges upon a rod and which, if the beam during each stroke across the target, impinges on combination of rods other than the two innermost rods, produces a correction voltage for the control of the deflection plates.

The combinations of two conductive rods accommodated on either side of the target give the information required for a possible correction for each stroke of the beam so that an automatically operating stabilization of the path which the beam describes can be obtained.

The control device which reacts to the voltage across the resistors preferably comprises both a correction system for the zero point adjustment of the beam and a correction system for the value of the amplitude of the beam.

The control device may be constructed in various manners. It has been found, however, that a very readily operating stabilization is obtained if the control device comprises a digital circuit having multistable vibrators to convert the pulses over the rods into a static signal, which static signals are supplied to a section for the control of the beam zero point adjustment and to a section for the control of the beam amplitude, the sections each comprising a comparison circuit to compare the supplied signals with the desired signals, a counter-circuit which receives a pulse in the case of a deviation in the comparison circuit and which sums it to a value present at its output, and a digital-to-analog converter which supplies an analog output voltage proportional to the value which is supplied to its input by the counter circuit.

Besides stabilization the rods may advantageously be used to make the position of the beam visible in a simple manner.

For that purpose, in a further embodiment of the invention the rods are furthermore connected to light-emissive indicators for the beams, an indicator lighting up as a result of voltage which is formed across the resistor of the associated rod if the rod is hit by the beam of charged particles. As indicators may be used lamps, neon tubes, light-emissive diodes, and so on.

The light indication can be improved if a voltage amplifier as well as a monostable multivibrator are incorporated in the connection of each rod to its associated indicator. A larger light intensity is obtained by the voltage amplifier, while the monostable multivibrator can extend the lighting-up times of the indicators.

If desired, each time more than two rods may be provided on one side of the connection place for the target. These further rods are not necessary for the stabilization but they may provide a further indication, for example, that stroke length of the beams is excessively large and hence an undesired time loss in operation occurs.

The invention will be described in greater detail with reference to the drawing. In the drawing.

Figure 3:
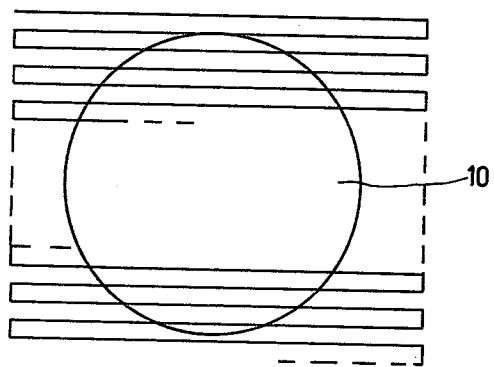
FIG. 3 shows a preferred pattern of the beam on the target.
Figure 4:
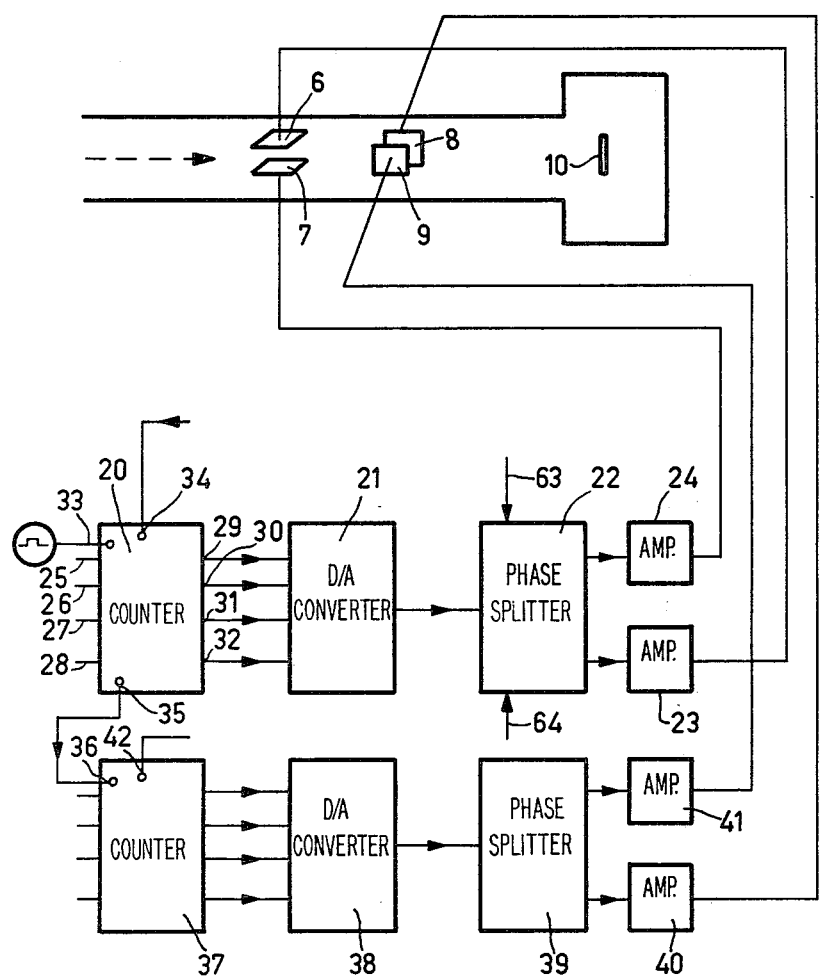
Figure 5:
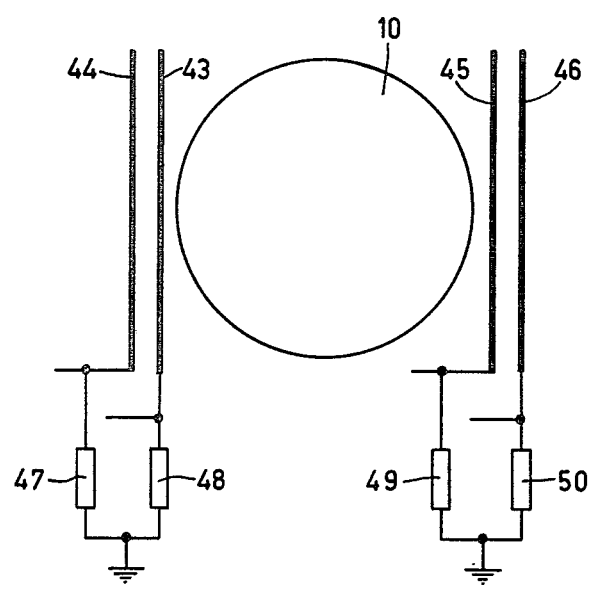
Figure 6:
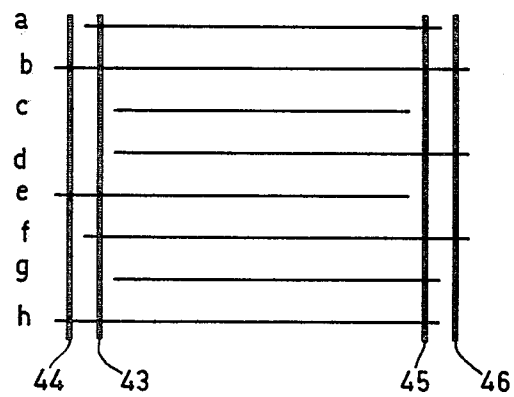

FIG. 4 shows an electronic control system to obtain the pattern shown in FIG. 3, FIG. 5 shows a target with stabilization rods according to the invention, FIG. 6 shows various positions which the beam can assume with respect to the stabilization rods, FIG. 7 shows an electronic control device for generating a stabilization voltage, FIG. 8 shows an example of the operation of the rods with light indicators.

In the following description of the invention, the use of stabilization and light indicators for an ion beam has been chosen by way of example. However, the invention may alternatively be used if the charged particles are electrons and hence stabilization and indication of the electron beam is to take place.

Figure 1:
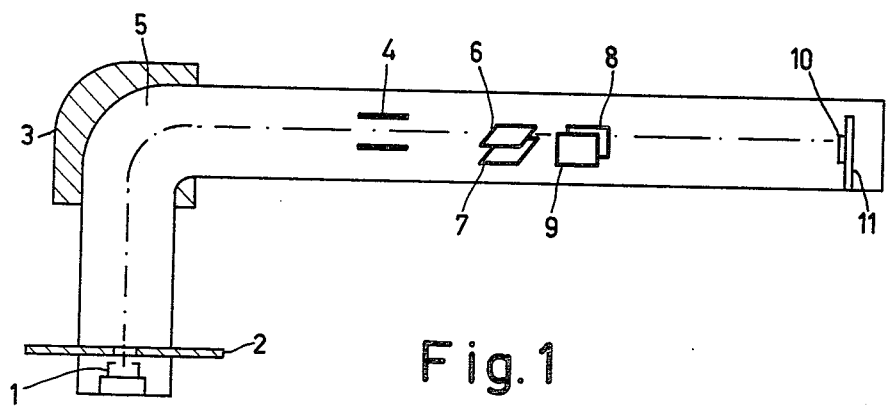
FIG. 1 is a diagrammatic view of an ion implantation machine.

FIG. 1 shows diagrammatically an ion implantation machine. Ions from an ion source 1 are accelerated by means of an electric field. This field is formed by a voltage difference between the ion source 1 and an accelerating electrode 2, which voltage difference may be, for example, 100 kV. The formed ion beam traverses a magnetic field having a strength adjusted by means of a deflection magnet 3 in such manner that only desired ions pass through a curve 5. Particles having a mass smaller or larger than the desired particles will impact against the outer and inner curves, respectively. The ions which have traversed through the curve 5 are focused on a target 10 which is secured to a support 11 by means of a system of lenses 4. The target 10 is, for example, a semiconductor disc which is implanted with ions to obtain one or more zones of the desired conductivity type. For this purpose the ion beam must described a pattern over the semiconductor disc 10.

The control of the ion beam takes place by means of an electrostatic deflection system. For this purpose the deflection plates 6, 7 and 8, 9 are present deflecting the beam in two mutually perpendicular directions. By controlling a differential voltage between the deflection plates 6, 7 and 8, 9, respectively, which differential voltage can be controlled, for example, to a maximum of 10 kV, the ion beam is deflected so that the semiconductor disc 10 is struck in a desired pattern. The principle of the operation of such an ion implantation machine is know per se and need not be further described.

Figure 2:
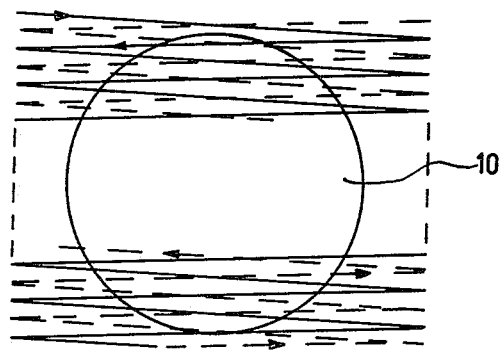
FIG. 2 shows a useful pattern which the ion beam describes over the target.

Frequently, zones throughout the semiconductor disc must be implanted with ions as homogeneously as possible. FIG. 2 is a diagrammatic example of a pattern in which the beam impinges upon the semiconductor disc in known devices. In the electrostatic deflection system used a triangular voltage is generated by a voltage generator. This voltage is split into a symmetrical signal with respect to earth, amplified, and supplied to the deflection plates. This is done both for the deflection plates 6, 7 which deflect the beam in the X-direction and for the deflection plates 8, 9 which can produce a beam displacement in the Y-direction. By controlling the value of the voltage on the X and Y deflection plates, the beam can impinge on the semiconductor disc according to the reciprocating line shown in FIG. 2 in which a rectangular field is described.

FIG. 3 shows an implantation pattern which is to be preferred over that of FIG. 2. In the pattern shown in FIG. 2, inter alia, a degree of inhomogeneity may arise by the partial overlapping of the reciprocating beam which impinges on the semiconductor disc as an area of, for example, circular or elliptical shape. This overlap can be prevented in the pattern shown in FIG. 3. The pattern shows in FIG. 3 can be obtained by causing the beam to be deflected under the influence of an electric field of varying strength, for example for the X-direction, and of a constant field for the Y direction. At the end of each stroke of the beam in the X-direction, the static field between the Y-deflection plates is varied by a small amount so that the beam covers a small distance in the Y-direction. The beam is then moved again in the X-direction, the field between the Y deflection plates remaining constant. The voltages required on the deflection plates may advantageously be produced digitally.

FIG. 4 shows an example to generate the deflection voltages digitally. An identical channel is used both for the voltage on the X deflection plates and on the Y deflection plates. For an explanation of the operation, the channel for generating the deflection voltage in the X-direction will be mainly described. In this embodiment the channel comprises a counter circuit 20 operating according to the binary system, a digital-to-analog converter 21, a phase splitting circuit 22 and two parallel output amplifiers 23 and 24 which are connected in opposite phases and are connected to the deflection plates 6 and 7, respectively. Each of the circuits consists of known electronic components.

The counter circuit 20 has a number of set inputs of which for simplicity four are shown, 25, 26, 27, 28 as well as the same number of outputs 29, 30, 31, 32. By means of the set inputs a preset can be given to the counter circuit 20. The counter circuit furthermore comprises a clock input 33 to which voltage pulses originating from an oscillator are applied and a count-up/count-down input 34 which causes the voltage pulses of the clock input to be counted up or counted down. The combination of the outputs 29 and 32 binarily represents the sum of the voltage pulses, the set of each output can be represented as a "0" or "1". With each further pulse, there is counted binarily so that at least at one of the outputs the setting varies. The setting of the outputs is passed on to the digital-to-analog converter 21 the output voltage of which is proportional to the binary value at the input.

The voltage present at the output of converter 21 is applied to the phase splitting circuit 21 and from there to the parallel output amplifiers 23 and 24 connected in opposite phases. Amplifier 23 supplies the voltage to deflection plate 6 while amplifier 24 supplies an equally large voltage of opposite sign to deflection plate 7.

The voltage pulses applied to the clock input 33 are summed by the counter circuit so that the voltage at the output of the converter 21 varies and consequently the voltage at the deflection plates 6 and 7 varies. So the ion beam is deflected in the X-direction. If all the outputs 29–32 have a set indicated by "1", the beam is deflected maximally and will be beside the semiconductor disc 10. A maximum/minimum output 35 present in the counter circuit 20 then generates a voltage variation which is applied to the clock input 36 for the counter circuit of the Y-channel. This pulse is summed in the Y-counter 37 to the value present at the outputs of such counter. The digital-to-analog converter 38 for tye Y-channel experiences a voltage variation by a step jump which by the phase splitting circuit 39 and the output amplifiers 40 and 41 produces a variation of the voltage at the Y deflection plates by one step.

The beam hence moves one step in the Y-direction. A digital circuit ensures that a "0" is presented to the count-up/count-down input 34 of the X counter circuit 20, so that the X counter starts counting down. The beam now moves over the semiconductor disc in the opposite direction. If all outputs 29-32 of the X counter 20 have come in the "0" setting, the beam is on the other side of the semiconductor disc. The maximum/minimum output 35 again generates a voltage variation so that the beam is again moved in the Y direction by one step. If the Y counter has reached the maximum position, so its outputs have a "1" set, the polarity of the Y count-up/count down input 42 is varied after which the beam described the pattern of FIG. 3 in the opposite direction. The operations are repeated until the desired implantation dose has been obtained.

It has been found however, that deviations may occur in the digital-to-analog converter, the phase splitter and the output amplifiers which may result in a variation of the zero point adjustment and/or a variation of the amplitude of the beam. The invention provides means to detect these deviations and to stabilize the zero point adjustment as well as the stroke length of the beam.

The stabilization will be described with reference to FIGS. 5-7 for the X-direction of the deflection system for the ion beam. Each time two rods 43, 44 and 45, 46 are accommodated on two oppositely located sides of the semiconductor disc 10. The rods consist of electrically conductive material, for example copper. The rods may be provided on the support 11 for the semiconductor disc 10 or, if desired, in any other place in proximity of the semiconductor disc. Each of the rods is connected to a fixed potential, for example earth potential, by resistors 47-50 and each of the rods is connected to a stabilization circuit by an electric conductor. If the ion beam impinges on one of the rods 43 to 46, a voltage pulse will be formed across the associated resistor, which voltage pulse is passed to the stabilization circuit.

FIG. 6 shows the various positions which the beam can assume during a stroke. The position a represents the correct path of the beam, the rods 43 and 45 are hit and pass a pulse to the stabilization circuit; the rods 44 and 46 are not hit. If a rod which is hit by the beam is denoted by "1" and a rod which is not hit is denoted by "0", the correct position of the beam is denoted by 0-1-1-0. For the stroke which the beam makes in the positions a to h in FIG. 6 the positions are given in the table below.

|   | 44 | 43 | 45 | 46 |
|---|----|----|----|----|
| a | 0  | 1  | 1  | 0  |
| b | 1  | 1  | 1  | 1  |
| c | 0  | 0  | 0  | 0  |
| d | 0  | 0  | 1  | 1  |
| e | 1  | 1  | 0  | 0  |
| f | 0  | 1  | 1  | 1  |
| g | 0  | 0  | 1  | 0  |
| h | 1  | 1  | 1  | 0  |

FIG. 7 shows an example of the stabilization circuit. The pulses orginating from the rods 43 to 46 are applied to a digital circuit 51 comprising multi-stable vibrators to convert the pulses into a static signal so that information regarding one of the positions of the above table is formed when the beam has covered a stroke over the semiconductor disc. The information from circuit 51 and its complementary value are applied to digital circuits 52 and 53. In these circuits the applied signals are compared with the desired adjusted values. Let it be assumed that a difference occurs both in the zero point adjustment and in amplitude, then circuit 52 will pass on a signal to the count-up/count-down input 54 of a counter circuit 55 as well as to a clock input 56 of the counter circuit. The counter output 57 passes the binarily summed value on to a digital-to-analog converter 58 so that at the output hereof a voltage is formed proportional to the binary value which appeared at the input. This voltage is passed on to the control of the zero level of the high voltage control for the deflection plates so that the zero point adjustment experiences a correction. The correction signal is preferably passed on to an input 63 of the circuit 22 of FIG. 4, which circuit also comprises pre-amplifiers for the voltage of the deflection plates. A constant value for the X-deflection plates is superimposed in the preamplifiers on the changing voltage by the zero point correction signal so that the voltage on one of the deflection plates becomes equally as much larger as the voltage on the other plate becomes smaller, and a correction of the position is obtained. Otherwise it is also possible to use the correction signal differently, for example, by generating a correcting voltage on auxiliary deflection plates (not shown) of the electrostatic deflection system.

The digital circuit 53 also compared the received pulses with the desired pulses and if there is no agreement, this circuit will also control a count-up/countdown input 59 of a counter 60 and a pulse will be applied to the clock input 61 of counter circuit 60. The output of the counter 60 passes the summed value on to the digital-to-analog converter 62 which influences the amplifude control of the voltage for the deflection plates. This correction voltage is also applied preferably to the preamplifiers present in the circuit 22 of FIG. 4 by input 64, in which the amplification factor is influenced. On the other hand, the correction voltage may be used to control auxiliary deflection plates, not shown.

In the subsequent stroke of the beam the process described is repeated until the pulses 0-1-1-0 are transmitted to the circuit 51, in which only the rods 43 and 45 are hit by the beam. The digital circuits 52 and 53 then indicate no difference from the desired value and a correction will not occur.

The stroke of the beam can thus be stabilized by means of the pulses which are formed when the rods 43-46 are hit by the beam; automatic correction for deviations is obtained without human control and intervention being necessary. It will be obvious that for a deflection of the beam in the Y-direction a similar stabilization may also be used.

The pulses obtained by the rods may also be used advantageously to obtain an indication of the stroke length of the beam. FIG. 8 shows an example hereof. If the ion beam which is to implant zones in the semiconductor disc hits one the rods 43-46 during its stroke, a voltage pulse will be formed across the associated resistors 47, 48, 49 and 50, respectively, as already indicated in the stabilization of the beam, which pulse may be used to cause a light indicator to light up. The pulse may be transmitted advantageously first to the input of an electronic voltage amplifier 65 to obtain a larger light intensity of the indicator in question. Furthermore, the amplified signal may be applied to a circuit 66 comprising monostable multivibrators. The received pulse which is of a very short duration is converted by the relevant monostable multivibrator into a pulse of longer duration so that the indicator in question lights up slightly longer and can be observed clearly.

The indicators are referenced 67-70 and are preferably placed in a pattern which corresponds to the arrangement of the rods as shown in FIG. 8. For example, if the beam impinges on rod 43, the indicator 67 will light up, and so on. In order to obtain a more extensive indication of the place where the beam is, more than two rods may be provided on each side of the semiconductor disc 10 and each be connected to an associated light indicator. It will furthermore be obvious that rods and light indicators may also be used to indicate the place of the beam in the Y direction. The a light indicator may be, for example, a lamp, a neon tube or a light-emissive diode.

The indication and the stabilization by means of the rods has been described with reference to a beam which describes a pattern as shown in FIG. 3. However, the invention is not restricted thereto; stabilization and indication of a beam describing a different pattern, for example that of FIG. 2, also falls within the scope of the present invention.

What is claimed is:

1. A device for directing electrically charge particles toward a target comprises a source of electrically charged particles, means for accelerating said particles, and deflecting means for controlling a beam of said charged particles in two mutually perpendicular directions, CHARACTERIZED IN THAT at least two juxtaposed rods of electrically conductive material are positioned at opposite sides of said target for detecting said beam, each of said rods being connected to a fixed potential by a resistor, and control means also being connected to each of said rods are provided for reacting to a voltage formed across said resistors if said beam impinges on said rods, said control means producing a correction voltage on said deflection means if said beam impinges on a combination of said rods other than ones closest adjacent said target.

2. A device according to claim 1, wherein said control means includes both a first correction means for correcting the zero point adjustment of said beam and a second correction means for correcting the value of the amplitude of said beam.

3. A device according to claim 2, wherein said control means comprises a digital circuit having multistable vibrating means for converting pulses across said rods into static signals, first circuit means receiving said static signals for controlling said zero point adjustment of said beam, and second circuit means receiving said static signals for controlling said beam amplitude, each of said first and second circuit means including comparison means for comparing received signals with predetermined signals, counting means for summing a pulse indicating a deviation said comparison means into an output signal, and digital to analog converter means for supplying an analog output signal proportional to said output signal from said counting means.

4. A device according to claims 1, 2 or 3, wherein said rods are connected to light-emitting indicator means for indicating if any of said rods is struck by said beam.

5. A device according to claim 4, wherein said light emitting indicator means includes a voltage amplifier and a monostable multivibrator for connecting each of said rods to an associated light emitter indicator.

6. A device according to claim 4, wherein more than two rods are placed at opposite sides of said target.

* * * * *